(12) United States Patent
Derrickson et al.

(10) Patent No.: US 11,990,535 B2
(45) Date of Patent: May 21, 2024

(54) LATERAL HETEROJUNCTION BIPOLAR TRANSISTOR WITH EMITTER AND/OR COLLECTOR REGROWN FROM SUBSTRATE AND METHOD

(71) Applicant: GLOBALFOUNDRIES U.S. Inc., Malta, NY (US)

(72) Inventors: Alexander M. Derrickson, Saratoga Springs, NY (US); Haiting Wang, Clifton Park, NY (US); Judson R. Holt, Ballston Lake, NY (US); Vibhor Jain, Williston, VT (US); Richard F. Taylor, III, Campbell, CA (US)

(73) Assignee: GlobalFoundries U.S. Inc., Malta, NY (US)

(*) Notice: Subject to any disclaimer, the term of this patent is extended or adjusted under 35 U.S.C. 154(b) by 114 days.

(21) Appl. No.: 17/511,613

(22) Filed: Oct. 27, 2021

(65) Prior Publication Data

US 2023/0065924 A1 Mar. 2, 2023

Related U.S. Application Data

(60) Provisional application No. 63/236,711, filed on Aug. 25, 2021.

(51) Int. Cl.
*H01L 29/737* (2006.01)
*H01L 21/02* (2006.01)
(Continued)

(52) U.S. Cl.
CPC ...... *H01L 29/737* (2013.01); *H01L 21/02532* (2013.01); *H01L 21/2251* (2013.01);
(Continued)

(58) Field of Classification Search
None
See application file for complete search history.

(56) References Cited

U.S. PATENT DOCUMENTS

| 5,102,812 | A  | * | 4/1992 | Caneau  | H01L 21/30612 |
|-----------|----|---|--------|---------|----------------|
|           |    |   |        |         | 438/494        |
| 6,503,808 | B1 | * | 1/2003 | Matsuno | H01L 29/66242  |
|           |    |   |        |         | 438/335        |

(Continued)

*Primary Examiner* — Evren Seven
*Assistant Examiner* — Cole Leon Lindsey
(74) *Attorney, Agent, or Firm* — Francois Pagette; Hoffman Warnick LLC

(57) ABSTRACT

Disclosed is a semiconductor structure including a lateral heterojunction bipolar transistor (HBT). The structure includes a substrate (e.g., a silicon substrate), an insulator layer on the substrate, and a semiconductor layer (e.g., a silicon germanium layer) on the insulator layer. The structure includes a lateral HBT with three terminals including a collector, an emitter, and a base, which is positioned laterally between the collector and the emitter and which can include a silicon germanium intrinsic base region for improved performance. Additionally, the collector and/or the emitter includes: a first region, which is epitaxially grown within a trench that extends through the semiconductor layer and the insulator layer to the substrate; and a second region, which is epitaxially grown on the first region. The connection(s) of the collector and/or the emitter to the substrate effectively form thermal exit path(s) and minimize self-heating. Also disclosed is a method for forming the structure.

20 Claims, 10 Drawing Sheets

(51) Int. Cl.
  *H01L 21/225*  (2006.01)
  *H01L 29/08*   (2006.01)
  *H01L 29/10*   (2006.01)
  *H01L 29/165*  (2006.01)
  *H01L 29/66*   (2006.01)

(52) U.S. Cl.
  CPC ...... *H01L 29/0808* (2013.01); *H01L 29/0817* (2013.01); *H01L 29/0821* (2013.01); *H01L 29/1008* (2013.01); *H01L 29/165* (2013.01); *H01L 29/66242* (2013.01)

(56) References Cited

U.S. PATENT DOCUMENTS

| | | |
|---|---|---|
| 6,940,149 B1 | 9/2005 | Divakaruni et al. |
| 6,949,764 B2 | 9/2005 | Ning |
| 8,420,493 B2 | 4/2013 | Ning et al. |
| 8,586,441 B1 | 11/2013 | Cai et al. |
| 10,825,921 B2 | 11/2020 | Balakrishnan et al. |
| 2005/0196931 A1* | 9/2005 | Li ............... H01L 29/737 438/312 |
| 2006/0284278 A1* | 12/2006 | Min ............... H01L 21/84 257/506 |
| 2013/0260526 A1* | 10/2013 | Cai ............... H01L 29/66242 257/E21.608 |

\* cited by examiner

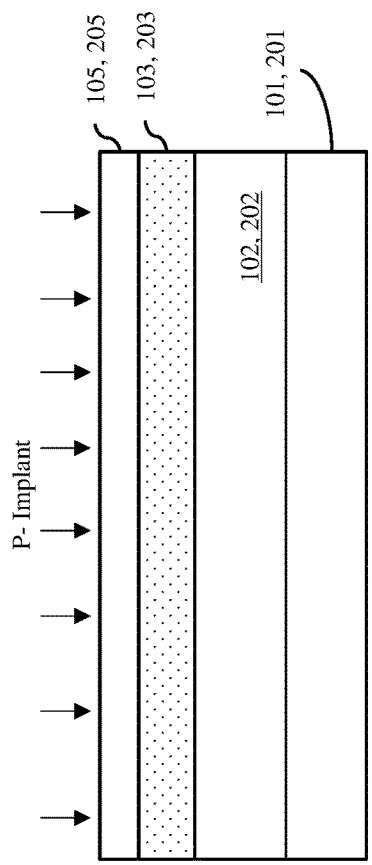
FIG. 4.2
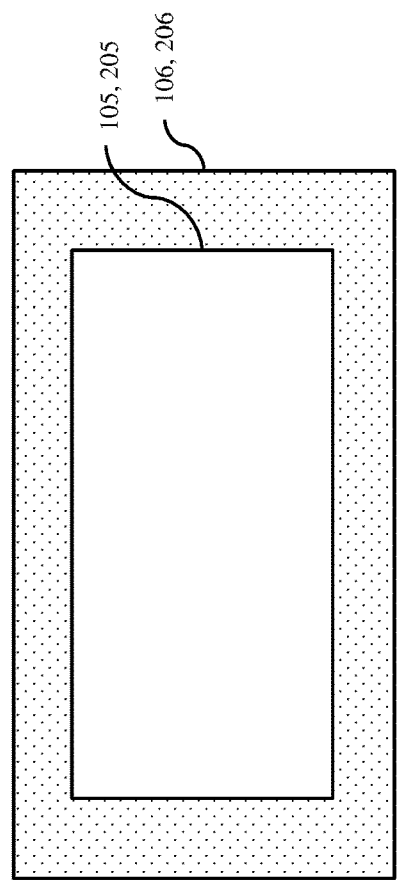
FIG. 4.3B
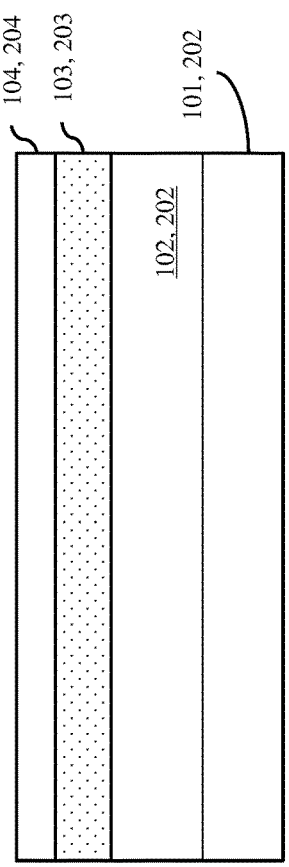
FIG. 4.1
FIG. 4.3A

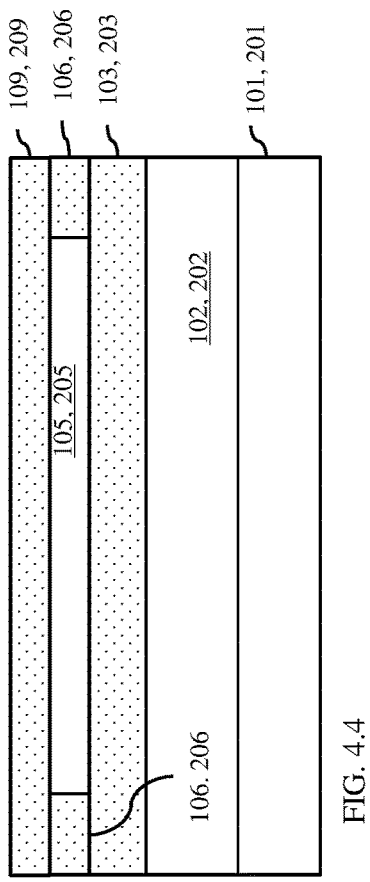
FIG. 4.4
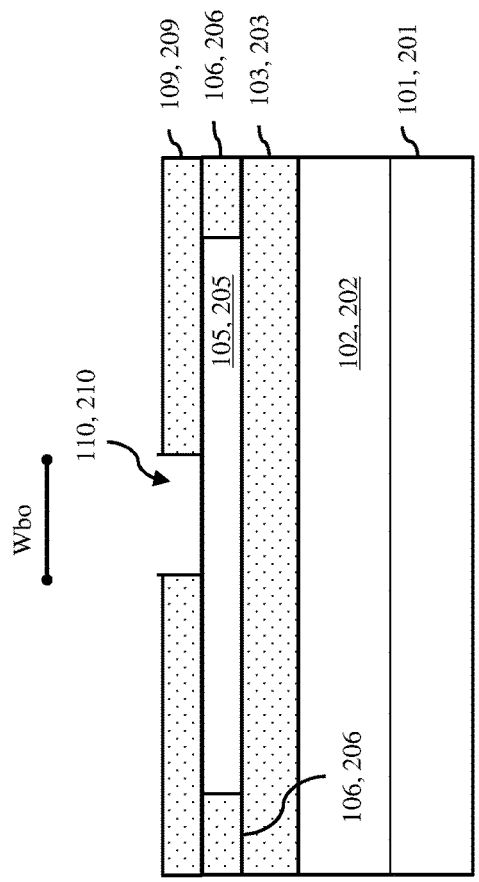
FIG. 4.5A
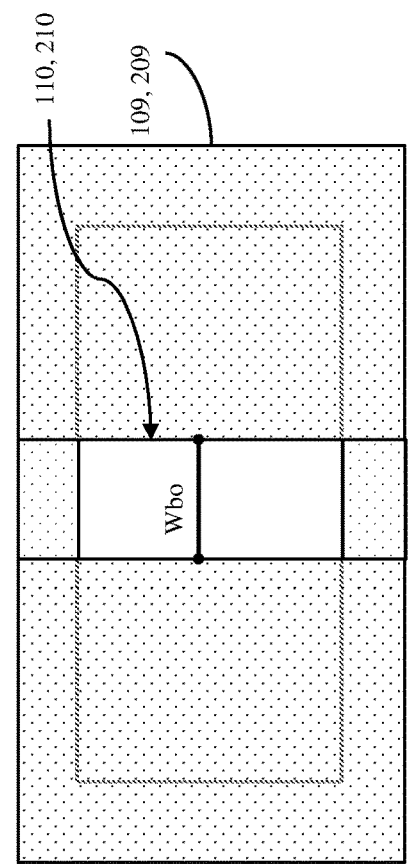
FIG. 4.5B

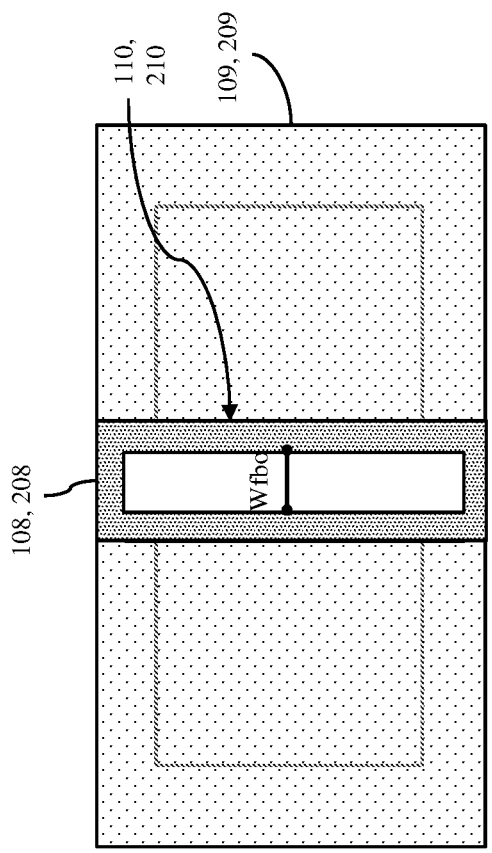
FIG. 4.6B
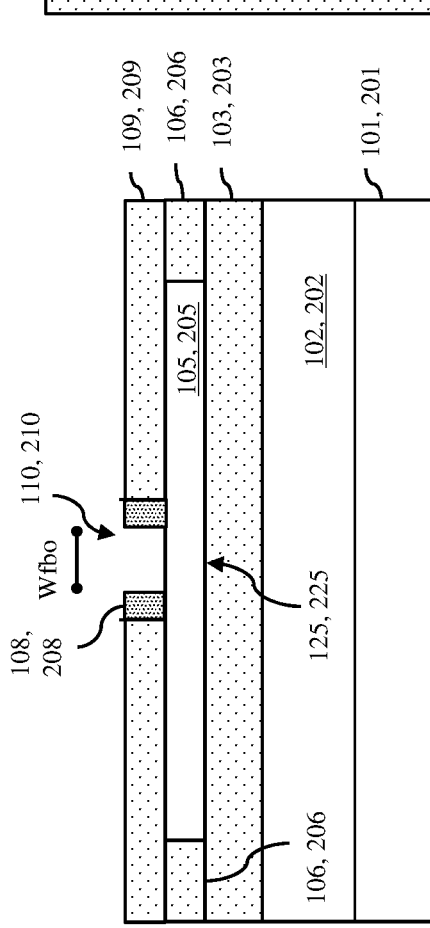
FIG. 4.6A
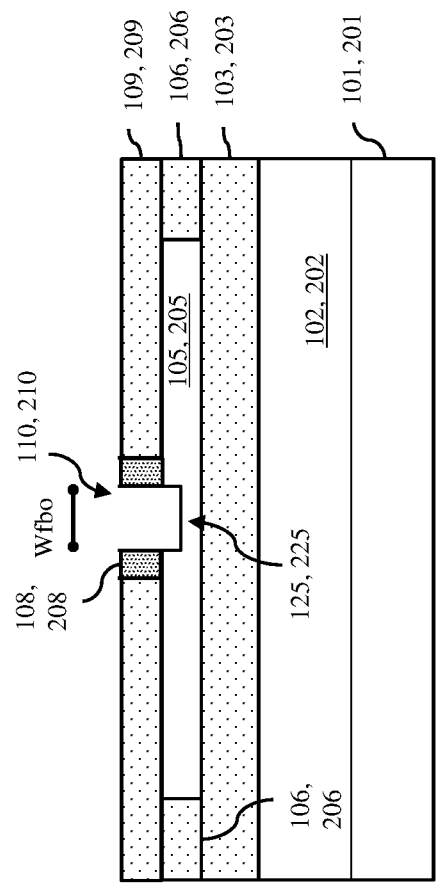
FIG. 4.7

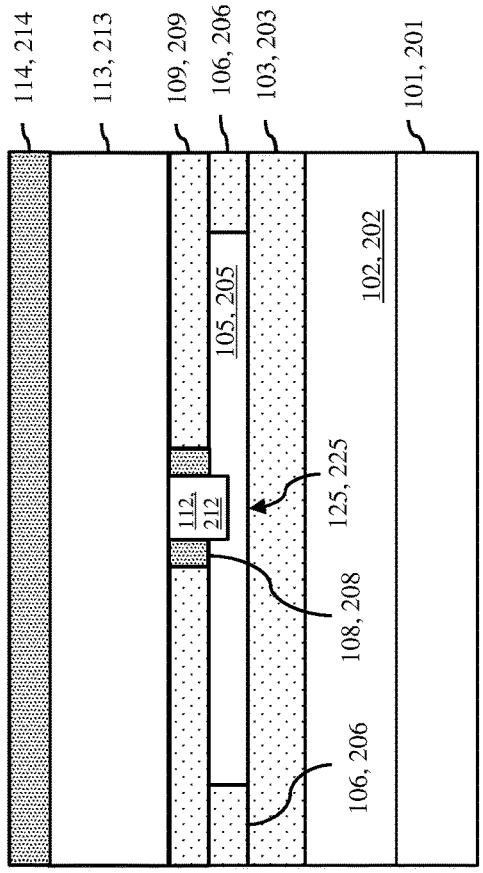
FIG. 4.9
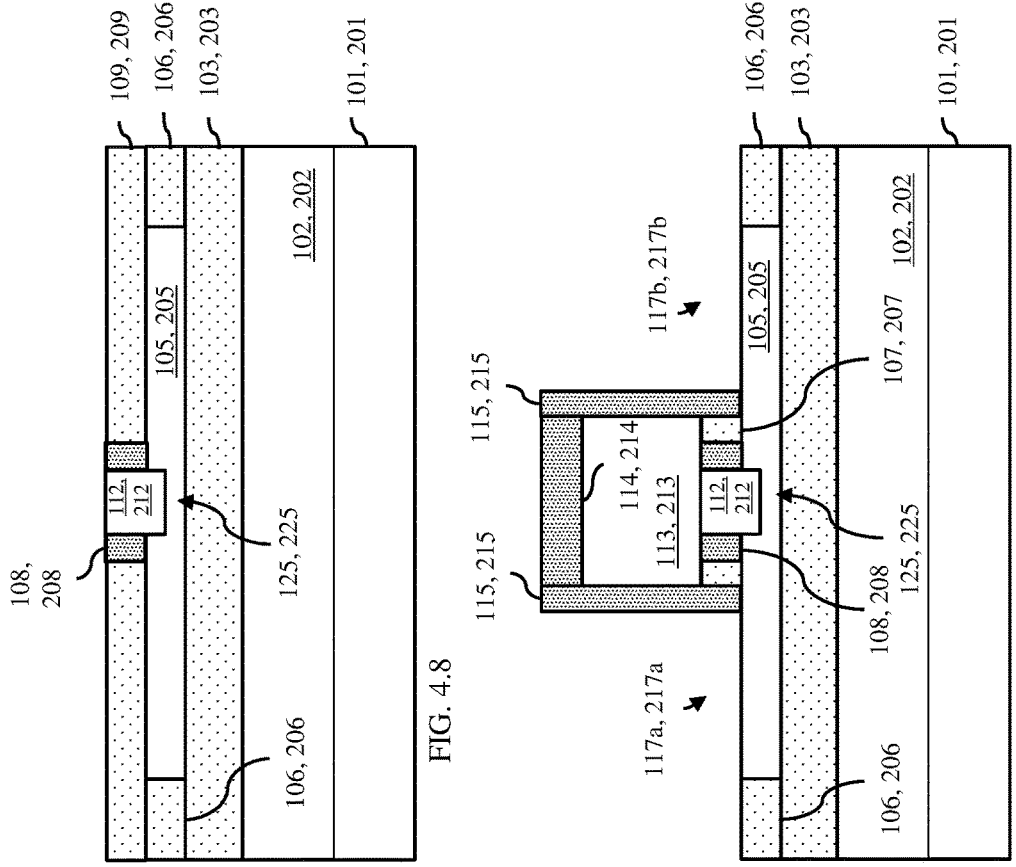
FIG. 4.8
FIG. 4.10

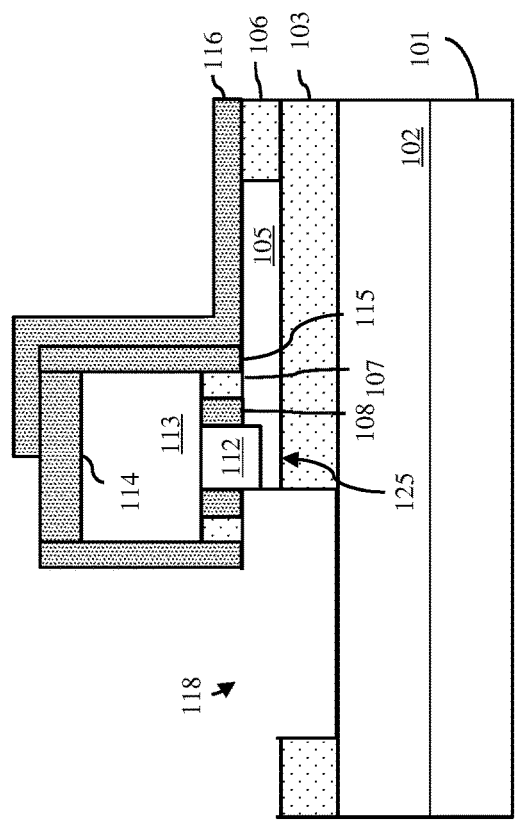
FIG. 4.12
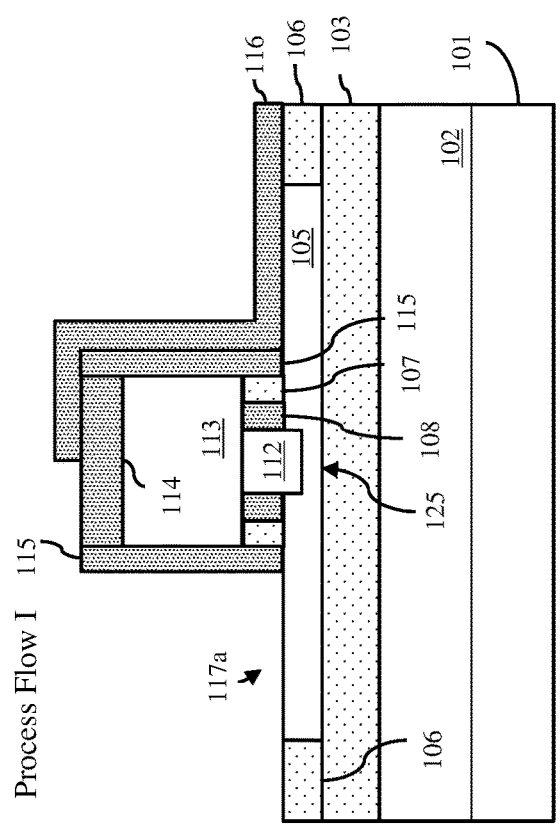
Process Flow I
FIG. 4.11
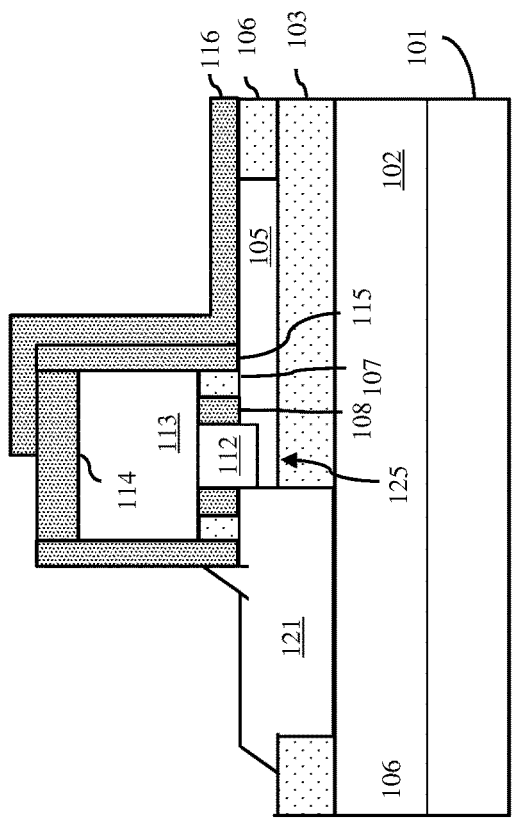
FIG. 4.13

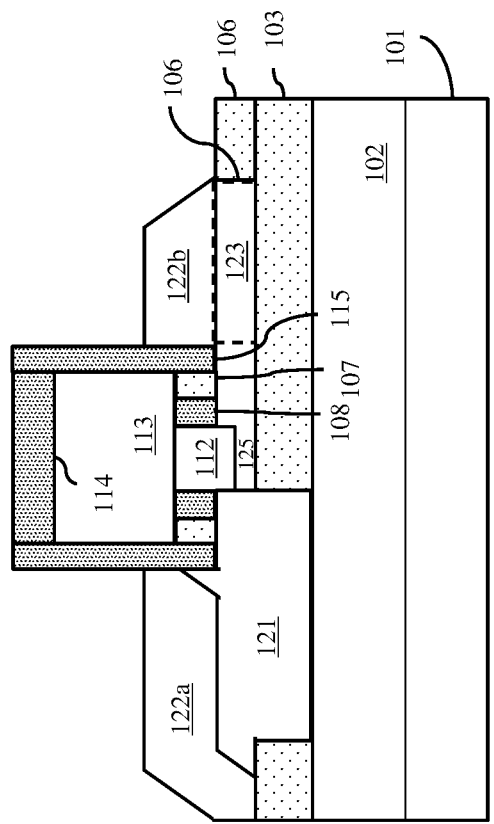
FIG. 4.15
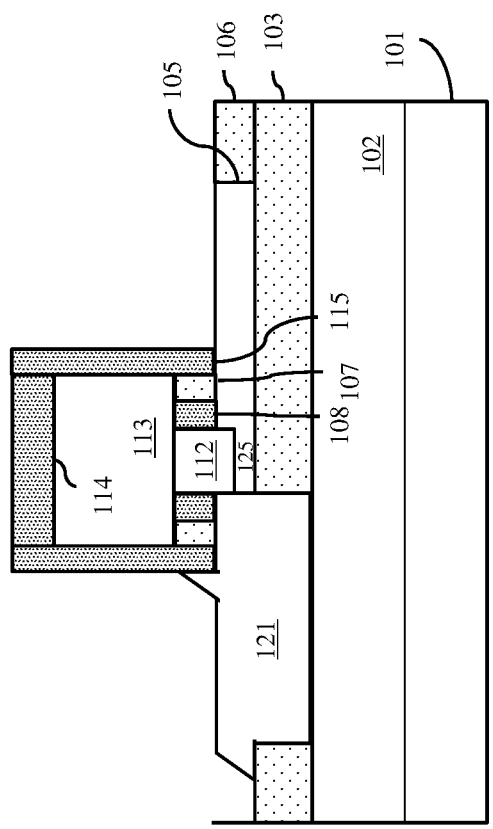
FIG. 4.14

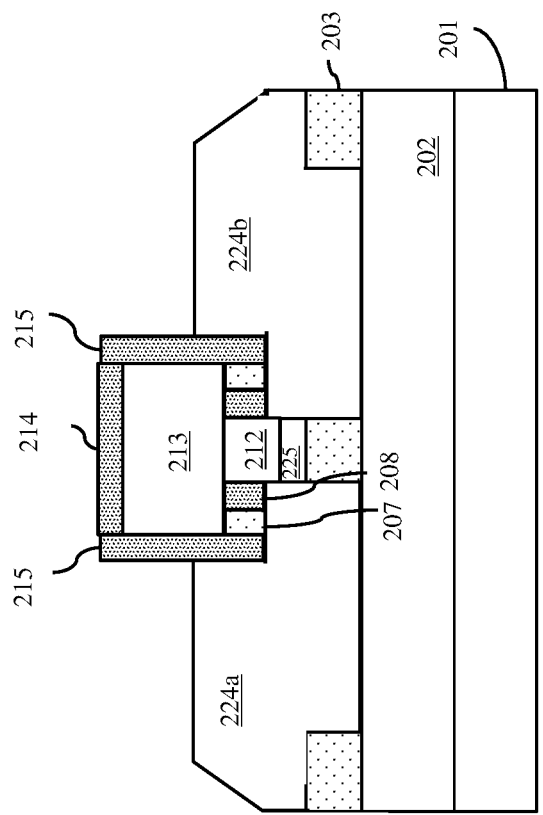
FIG. 4.17
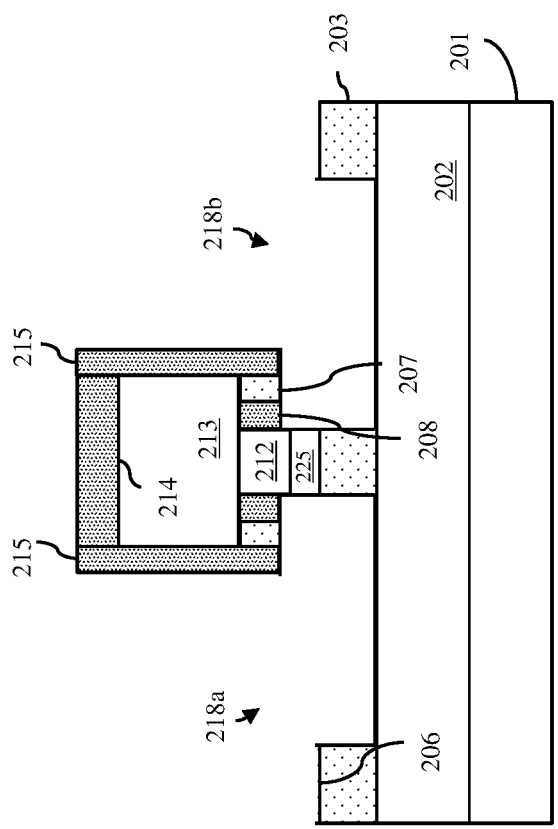
FIG. 4.16

US 11,990,535 B2

LATERAL HETEROJUNCTION BIPOLAR TRANSISTOR WITH EMITTER AND/OR COLLECTOR REGROWN FROM SUBSTRATE AND METHOD

BACKGROUND

Field of the Invention

The present invention relates to heterojunction bipolar transistors (HBTs) and, more particularly, to embodiments of semiconductor structure including a lateral HBT and embodiments of a method of forming the semiconductor structure.

Description of Related Art

Advantages associated with manufacturing complementary metal oxide semiconductor (CMOS) designs using advanced silicon-on-insulator (SOI) processing technology platforms (e.g., a fully-depleted silicon-on-insulator (FD-SOI) processing technology platform) include, for example, reduced power, reduced area consumption, reduced cost, high performance, multiple core threshold voltage (Vt) options, etc. CMOS designs manufactured on such SOI wafers are used in a variety of applications including, but not limited to, Internet-of-Things (IOT) devices, wearable devices, smartphone processors, automotive electronics, and radio frequency integrated circuits (RFICs) (including millimeter wave (mmWave) ICs). These same applications could benefit from the inclusion of bipolar junction transistors (BJTs) because BJTs tend to have more drive and are generally considered better suited for analog functions than field effect transistors (FETs). Typically, BJTs are formed as vertical devices (e.g., with an in-substrate collector, a base aligned above the collector, and an emitter aligned above the base). Lateral BJTs have been developed that can be incorporated into advanced SOI technology platforms along with CMOS devices. However, these devices can exhibit undesirable self-heating as well as poor performance (e.g., low cut-off frequency (fT)/maximum oscillation frequency (fmax) and beta cut-off frequency).

SUMMARY

Generally, disclosed herein are embodiments of a semiconductor structure. The structure can include a substrate. The substrate can be a first semiconductor material (e.g., silicon). The structure can include an insulator layer (e.g., a silicon dioxide layer) on the substrate. The structure can further include a semiconductor layer on the insulator layer. The semiconductor layer can be a second semiconductor material (e.g., silicon germanium), which is different from the first semiconductor material. The structure can further include a transistor and, particularly, a lateral heterojunction bipolar transistor (HBT). This lateral HBT can include three terminals. The three terminals can include a collector, an emitter, and a base, which is positioned laterally between the collector and the emitter, which is above the insulator layer, and which can include an intrinsic silicon germanium base region for improved performance. Additionally, the collector and/or the emitter can include: a first region, which is epitaxially grown within a trench that extends through the semiconductor layer and the insulator layer to the substrate; and a second region, which is epitaxially grown on the first region. The connection(s) of the collector and/or the emitter to the substrate effectively form thermal exit path(s) into the substrate and, thus, minimize self-heating.

Also disclosed herein are method embodiments for forming the above-described structures.

One method embodiment can include forming a semiconductor layer on an insulator layer above a substrate. The substrate can be a first semiconductor material (e.g., silicon) and the semiconductor layer can be a second semiconductor material (e.g., silicon germanium), which is different from the first semiconductor material. This method embodiment can further include forming a transistor and, particularly, a lateral heterojunction bipolar transistor (HBT). This lateral HBT can be formed so that it includes three terminals. The three terminals can include a collector, an emitter, and a base, which is above the insulator layer, which is positioned laterally between the collector and the emitter, and which can include an intrinsic silicon germanium base region for improved performance. Additionally, the collector or the emitter can include: a first region, which is epitaxially grown within a trench that extends through the semiconductor layer and the insulator layer to the substrate; and a second region, which is epitaxially grown on the first region.

Another method embodiment can include forming a semiconductor layer on an insulator layer above a substrate. The substrate can be a first semiconductor material (e.g., silicon) and the semiconductor layer can be a second semiconductor material (e.g., silicon germanium), which is different from the first semiconductor material. This method embodiment can further include forming a transistor and, particularly, a lateral heterojunction bipolar transistor (HBT). This lateral HBT can be formed so that it includes three terminals. The three terminals can include a collector, an emitter, and a base, which is above the insulator layer, which is positioned laterally between the collector and the emitter, and which can include an intrinsic silicon germanium base region for improved performance. Additionally, the collector and the emitter can each include: a first region, which is epitaxially grown within a trench that extends through the semiconductor layer and the insulator layer to the substrate; and a second region, which is epitaxially grown on the first region.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 4.1 is a cross-section diagram illustrating a partially completed structure formed according to the flow diagram of FIG. 3;

FIG. 4.2 is a cross-section diagram illustrating a partially completed structure formed according to the flow diagram of FIG. 3;

FIGS. 4.3A and 4.3B are cross-section and top view diagrams illustrating a partially completed structure formed according to the flow diagram of FIG. 3;

FIG. 4.4 is a cross-section diagram illustrating a partially completed structure formed according to the flow diagram of FIG. 3;

FIGS. 4.5A and 4.5B are cross-section and top view diagrams illustrating a partially completed structure formed according to the flow diagram of FIG. 3;

FIGS. 4.6A and 4.6B are cross-section and top view diagrams illustrating a partially completed structure formed according to the flow diagram of FIG. 3;

FIG. 4.7 is a cross-section diagram illustrating a partially completed structure formed according to the flow diagram of FIG. 3;

FIG. 4.8 is a cross-section diagram illustrating a partially completed structure formed according to the flow diagram of FIG. 3;

FIG. 4.9 is a cross-section diagram illustrating a partially completed structure formed according to the flow diagram of FIG. 3;

FIG. 4.10 is a cross-section diagram illustrating a partially completed structure formed according to the flow diagram of FIG. 3;

FIGS. 4.11-4.15 are cross-section diagrams illustrating partially completed structures, respectively, formed according to process flow I in the flow diagram of FIG. 3 during formation of either of the structures shown in FIG. 1A or 1B; and FIGS. 4.16-4.17 are cross-section diagrams illustrating partially completed structures, respectively, formed according to process flow II in the flow diagram of FIG. 3 during formation of the structures shown in FIG. 2.

DETAILED DESCRIPTION

As mentioned above, lateral bipolar junction transistors (BJTs) have been developed that can be incorporated into advanced silicon-on-insulator (SOI) technology platforms along with complementary metal oxide semiconductor (CMOS) devices. However, these devices can exhibit undesirable self-heating as well as poor performance (e.g., low cut-off frequency (fT)/maximum oscillation frequency (fmax) and beta cut-off frequency).

In view of the foregoing, disclosed herein are embodiments of a semiconductor structure with a lateral heterojunction bipolar transistor (HBT), which includes an emitter and/or a collector grown from the substrate in order to form thermal exit path(s) from the lateral HBT through an insulator layer and into the substrate and which also includes a silicon germanium intrinsic base region for improved performance. Specifically, the disclosed structure embodiments can include a substrate (e.g., a silicon substrate), an insulator layer on the substrate, and a semiconductor layer (e.g., a silicon germanium layer) on the insulator layer. The disclosed structure embodiments can also include a transistor and, particularly, a lateral HBT. The lateral HBT can have three terminals including a collector, an emitter, and a base, which is positioned laterally between the collector and the emitter and which includes a silicon germanium intrinsic base region for improved performance (e.g., for higher fT/fmax and beta cut-off frequency). Additionally, the collector and/or the emitter can specifically include a first region, which is epitaxially grown within a trench that extends through the semiconductor layer and the insulator layer to the substrate, and a second region, which is epitaxially grown on the first region. The connection(s) of the collector and/or the emitter to the substrate effectively form thermal exit path(s) into the substrate and, thus, minimize self-heating. Also disclosed herein are embodiments of a method for forming the above-described structures.

Figure 1:
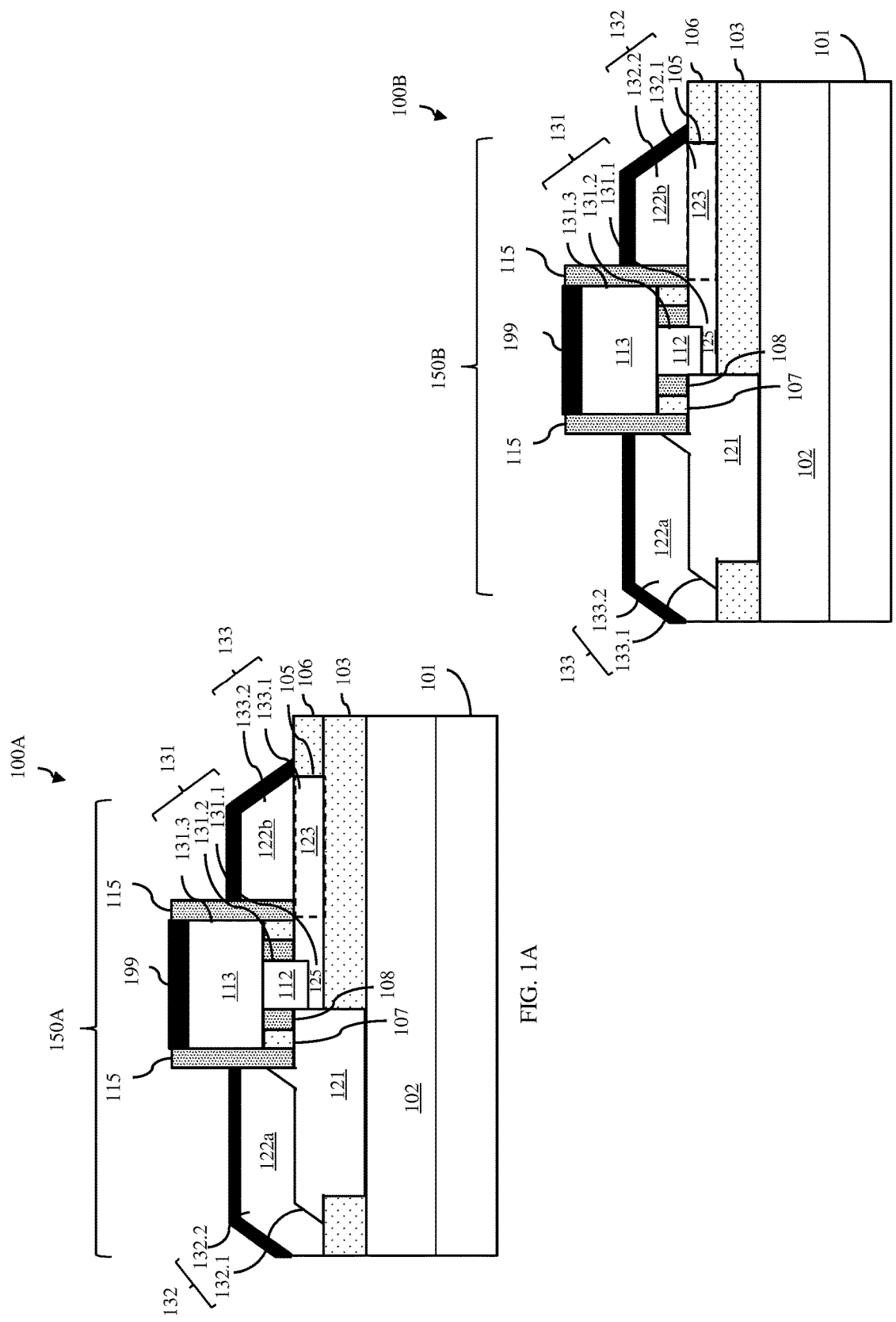
FIG. 1A is a cross-section drawing illustrating an embodiment of a structure including a lateral heterojunction bipolar transistor (HBT) with asymmetric emitter and collector regions.
FIG. 1B is a cross-section drawing illustrating an alternative embodiment of a structure including a lateral HBT with asymmetric emitter and collector regions.
Figure 2:
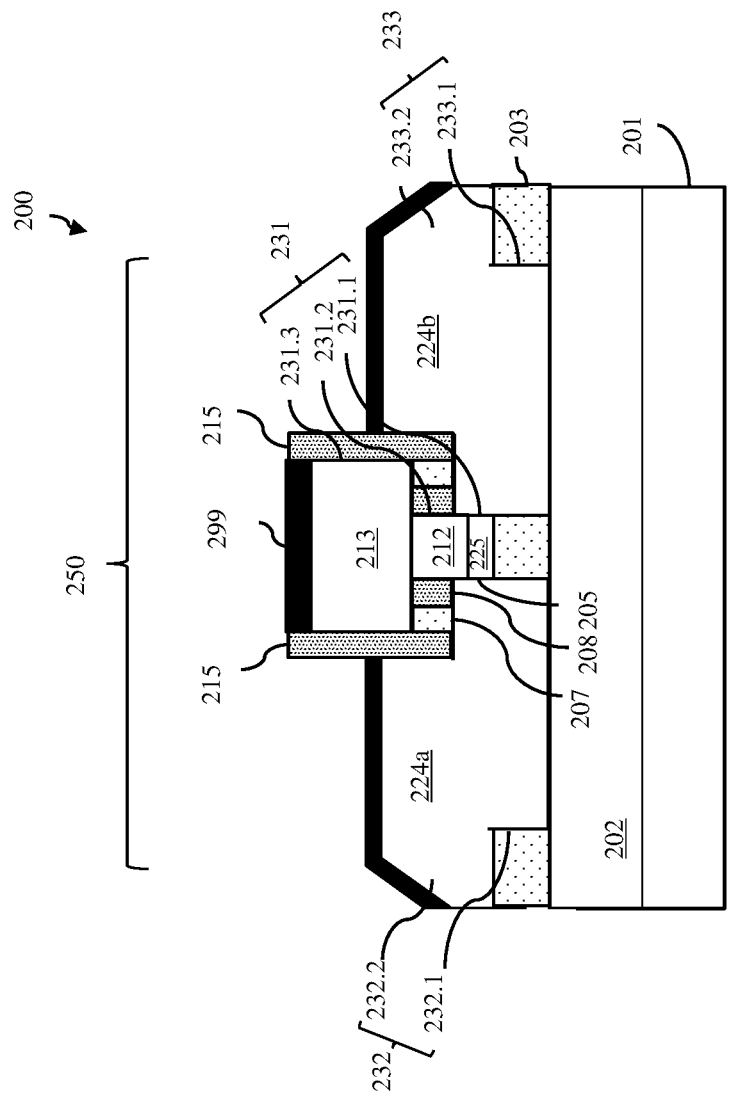
FIG. 2 is a cross-section drawing illustrating yet another embodiment of a structure including a lateral HBT.

More particularly, disclosed herein are embodiments of a semiconductor structure and, particularly, a semiconductor-on-insulator structure (e.g., a silicon-on-insulator (SOI) structure) that includes a lateral heterojunction bipolar transistor (HBT). Specifically, FIGS. 1A and 1B are cross-section drawings illustrating alternative embodiments of a semiconductor-on-insulator structure (e.g., an SOI structure) 100A, 100B including a lateral HBT 150A 150B with asymmetric emitter and collector regions. FIG. 2 is a cross-section drawing illustrating yet another embodiment of a semiconductor-on-insulator structure (e.g., another SOI structure) 200 including a lateral HBT 250 (e.g., with optionally symmetric emitter and collector regions).

Those skilled in the art will recognize that a BJT will typically include three terminals: a collector, an emitter, and a base between the collector and the emitter. The base will include at least an extrinsic base region having a first-type conductivity and the collector and the emitter will have a second-type conductivity that is different from the first-type conductivity. Thus, for an NPN-type BJT, the base will include at least a P-type base between an N-type collector and an N-type emitter; whereas, for a PNP-type BJT, the base will include at least an N-type base between a P-type collector and a P-type emitter. In the disclosed embodiments, the lateral HBT 150A-150B, 250 is described, for illustration purposes, as being an NPN-type lateral HBT, where the first-type conductivity of the base is P-type, and where the second-type conductivity of the collector and emitter is N-type. However, it should be understood that the description is not intended to be limiting and that, alternatively, the lateral HBT 150A-150B, 250 could be a PNP-type lateral HBT, where the first-type conductivity of the base is N-type, and where the second-type conductivity of the collector and emitter is P-type.

Referring to FIGS. 1A-1B and 2, the structure 100A-100B, 200 can include a semiconductor substrate. The semiconductor substrate 101, 201 can be a first semiconductor material (e.g., silicon), which is monocrystalline in structure and which is doped so as to have a first-type conductivity (e.g., P-type conductivity) at a relatively low conductivity level. Thus, for example, the substrate 101, 201 can be a P− silicon substrate.

Optionally, the structure 100A-100B, 200 can further include a well 102, 202 (also referred to as a dopant implant region) within the substrate 101, 201 adjacent to the top surface. The well 102, 202 could, for example, be doped so as to have the first-type conductivity. Thus, for example, the well 102, 202 can be a Pwell.

The structure 100A-100B, 200 can further include an insulator layer 103, 203 on the top surface of the substrate 101, 201 (e.g., over the well 102, 202). The insulator layer 103, 203 can be, for example, a silicon dioxide layer (also referred to herein as a buried oxide (BOX) layer) or a layer of any other suitable insulator material.

The structure 100A-100B, 200 can further include a semiconductor layer 105, 205 on the insulator layer 103, 203. The semiconductor layer 105, 205 can be a second semiconductor material, which is monocrystalline in structure and different from the first semiconductor material. For example, the semiconductor layer 105, 205 could be a silicon germanium layer. The semiconductor layer 105, 205 can be undoped. Alternatively, the semiconductor layer 105, 205 can be doped so as to have the first-type conductivity (e.g., P-type conductivity) at a relatively low conductivity level. For example, the semiconductor layer 105, 205 can be a P− silicon germanium layer.

The structure 100A-100B, 200 can further include shallow trench isolation (STI) region. The STI regions can extend essentially vertically through the semiconductor layer 105, 205 to the insulator layer 103, 203 and can define the boundaries of a device area.

The structure 100A-100B, 200 can further include a transistor and, particularly, a lateral heterojunction bipolar transistor (HBT) 150A-150B, 250. This lateral HBT 150A-150B, 250 can include three terminals. The three terminals can include a collector 132, 232, an emitter 133, 233, and a base 131, 231 positioned laterally between the collector 132, 232 and the emitter 133, 233.

The base 131, 231 can be above the insulator layer 103, 203 and can include three different stacked regions. These three different stacked regions can include a first base region 131.1, 231.1, a second base region 131.2, 231.2 above the first base region, and a third base region 131.3, 231.3 above the second base region 131.2, 231.2.

The first base region 131.1, 231.1 can be within the semiconductor layer 105, 205 and, more particularly, can include a portion 125, 225 of the semiconductor layer 105, 205, which optionally has a recessed top surface and which, after processing, remains monocrystalline in structure and is either undoped or doped with the first-type conductivity (e.g., P-type conductivity) at a relatively low conductivity level. For example, the first base region 131.1, 231.1 can be an undoped monocrystalline silicon germanium base region or a P− monocrystalline silicon germanium base region.

The second base region 131.2, 231.2 can be an epitaxial semiconductor layer 112, 212 of the second semiconductor material (e.g., silicon germanium). This epitaxial semiconductor layer 112, 212 can fill a relatively narrow base opening, which is defined by the space between first sidewall spacers 108, 208 (e.g., sidewall spacers made of silicon nitride or some other suitable dielectric sidewall spacer material) and which is aligned above the portion 125, 225 of the semiconductor layer 105, 205. In other words, the second base region 131.2, 231.2 is positioned laterally between the first sidewall spacers 108, 208 and aligned above the first base region 131.1, 231.1 as illustrated. The epitaxial semiconductor layer 112, 212 can be selectively grown from the semiconductor layer 105, 205 during processing so that it is essentially monocrystalline in structure. The epitaxial semiconductor layer 112, 212 can be undoped, doped so as to have the first-type conductivity at a relatively low conductivity level, or doped so as to have a graded dopant profile (e.g., from undoped or low-doped near the semiconductor layer 105, 205 to high-doped away from the semiconductor layer 105, 205). Thus, for example, the second base region 131.2, 231.2 can be entirely a monocrystalline silicon germanium intrinsic base region (i-SiGe base) or, alternatively, doped so as to be P− or so as to have a graded profile from undoped or P− to P or P+.

It should be noted that second sidewall spacers 107 (e.g., sidewall spacers made of silicon dioxide or some other suitable dielectric sidewall spacer material) can be positioned laterally adjacent to the first sidewall spacers 108, 208 on opposing sides of the second base region 131.2, 231.2. The first and second sidewall spacers can have essentially the same heights and, more particularly, the tops of the first and second sidewall spacers can be essentially co-planar.

The third base region 131.3, 231.3 can be aligned above, can be immediately adjacent to, and can be wider than the second base region 131.2, 231.2 such that it extends laterally over the first sidewall spacers 108, 208 and the second sidewall spacers 107, 207. Thus, the base 131, 231 is essentially T-shaped. As illustrated, opposing sidewalls of the third base region 131.3, 231.3 can be essentially vertically aligned with outer vertical surfaces of the second sidewall spacers 107, 207. The third base region 131.3, 231.3 can be an epitaxial semiconductor layer 113, 213 of the first semiconductor material (e.g., silicon) or, alternatively, some other suitable base semiconductor material. The epitaxial semiconductor layer 113, 213 can be non-selectively grown so that it is essentially polycrystalline in structure (e.g., so that it is polysilicon). The epitaxial semiconductor layer 113, 213 can doped so as to have the first-type conductivity (e.g., P-type conductivity) at a relatively high conductivity level and, particularly, at a higher conductivity level then the substrate (and at a higher conductivity level than the lower base regions). Thus, for example, the third base region 131.3, 231.3 can be a P+ polysilicon extrinsic base region.

It should be noted that third sidewall spacers 115 (e.g., sidewall spacers made of silicon nitride or some other suitable dielectric sidewall spacer material) can be positioned laterally adjacent to the opposing sidewalls of the third base region 131.3, 231.3 and can also cover the outer vertical surfaces of the second sidewall spacers 107, 207 below.

As mentioned above, the three terminals of the lateral HBT 150A-150B, 250 can also include a collector 132, 232 and the emitter 133, 233 on opposing sides of the base 131, 231. The collector and the emitter can both be made of the first semiconductor material (e.g., silicon) or some other suitable collector/emitter semiconductor material, can both be monocrystalline in structure, and can both have the second-type conductivity (e.g., N-type conductivity). Additionally, the collector 132, 232 and/or the emitter 133, 233 can include: a first region, which is selectively epitaxially grown within a trench that extends through the semiconductor layer 105, 205 and the insulator layer 103, 203 to the substrate 101, 201; and a second region, which is selectively epitaxially grown on the first region. The connection(s) of the collector and/or the emitter to the substrate effectively form thermal exit path(s) into the substrate and, thus, minimize self-heating.

More specifically, referring to the structure 100A in FIG. 1A, in this embodiment, the collector 132 of the lateral HBT 150A can include a first collector region 132.1, which is epitaxially grown within a trench that extends through the semiconductor layer 105 and the insulator layer 103 to the substrate 101; and a second collector region 132.2, which is epitaxially grown on the first collector region 132.1. That is, a trench can be on one side of the base 131 and can extend through the semiconductor layer 105 and the insulator layer 103 to or into the top surface of the substrate 101 (e.g., to the well 102). Optionally, this trench can undercut one or more of the sidewalls spacers positioned laterally adjacent to the base.

The first collector region 132.1 of the collector 132 can include a lower epitaxial semiconductor layer 121 of the first semiconductor material (e.g., silicon) or of some other suitable collector semiconductor material. The lower epitaxial semiconductor layer 121 can be selectively grown during processing from the substrate at the bottom of the trench such that it is monocrystalline in structure. The lower epitaxial semiconductor layer 121 can fill or, optionally, overfill the trench. The lower epitaxial semiconductor layer 121 can be in situ doped so as to have the second-type conductivity. It should be noted that, if the trench undercuts sidewall spacers 107 and, optionally 108, the third base region 131.3 will extend over a proximal portion of the first collector region 132.1. The second collector region 132.2 of the collector 132 can include an upper epitaxial semiconductor layer 122*a* of the first semiconductor material (e.g., silicon) or of some other suitable collector semiconductor material. The upper epitaxial semiconductor layer 122*a* can cover the top surface of the first collector region 132.1 and can be separated from the base 131 by an adjacent third sidewall spacer 115. The upper epitaxial semiconductor layer 122*a* can be selectively grown from the lower layer below so that it is also monocrystalline in structure and can be in situ doped so that it also has the second-type conductivity. In some embodiments, the lower epitaxial semiconductor layer 121 and the upper epitaxial semiconductor layer 122*a* of the collector 132 can both be doped so as to have the second-type conductivity at essentially the same conductivity level (e.g., so that both the first collector region 132.1 and the second collector region 132.2 are N+ silicon collector regions). In other embodiments, the lower epitaxial semiconductor layer 121 and the upper epitaxial semiconductor layer 122*a* of the collector 132 can be doped so as to have the second-type conductivity at different conductivity levels. For example, the lower epitaxial semiconductor layer 121 can be doped so as to have a lower conductivity level than the upper epitaxial semiconductor layer 122*a* (e.g., so that the first collector region 132.1 is an N− silicon collector region and so that the second collector region 132.2 is an N+ silicon collector region).

In this embodiment, the collector 132 and the emitter 133 of the lateral HBT 150A can be asymmetric. Specifically, the emitter 133 of the lateral HBT 150A can include a first emitter region 133.1 and a second emitter region 133.2. on the first emitter region 133.1. The first emitter region 133.1 can be a doped region 123 within the semiconductor layer 105 above the insulator layer 103. This doped region 123 can have the second-type conductivity (e.g., N-type conductivity) at a relatively high conductivity level and can be positioned laterally adjacent to the first base region 131.1, which as mentioned above is also within the same semiconductor layer. Since the semiconductor layer 105 is made of the second semiconductor material (e.g., silicon germanium), this first emitter region 133.1 can be, for example, an N or N+ silicon germanium emitter region. The second emitter region 133.2 can be another upper epitaxial semiconductor layer 122*b*, which, during processing, is concurrently grown and in situ doped along with the upper epitaxial semiconductor layer 122*a* of the collector 132, which covers the top surface of the first emitter region 133.1, and which is separated from the base 131 by an adjacent third sidewall spacer 115. Thus, for example, the second emitter region 133.2 can be an N+ silicon emitter region.

Alternatively, referring to the structure 100B in FIG. 1B, in this embodiment, the emitter 133 of the lateral HBT 150B can include a first emitter region 133.1, which is epitaxially grown within a trench that extends through the semiconductor layer 105 and the insulator layer 103 to the substrate 101; and a second emitter region 133.2, which is epitaxially grown on the first emitter region 133.1. That is, a trench can be on one side of the base 131 and can extend through the semiconductor layer 105 and the insulator layer 103 to or into the top surface of the substrate 101 (e.g., to the well 102). Optionally, this trench can undercut one or more of the sidewalls spacers positioned laterally adjacent to the base.

The first emitter region 133.1 of the emitter 133 can include a lower epitaxial semiconductor layer 121 of the first semiconductor material (e.g., silicon) or of some other suitable emitter semiconductor material. The lower epitaxial semiconductor layer 121 can be selectively grown during processing from the substrate at the bottom of the trench such that it is monocrystalline in structure. The lower epitaxial semiconductor layer 121 can fill or, optionally, overfill the trench. The lower epitaxial semiconductor layer 121 can be in situ doped so as to have the second-type conductivity. It should be noted that, if the trench undercuts sidewall spacers 107 and, optionally 108, the third base region 131.3 will extend over a proximal portion of the first emitter region 133.1. The second emitter region 133.2 of the emitter 133 can include an upper epitaxial semiconductor layer 122*a* of the first semiconductor material (e.g., silicon) or of some other suitable emitter semiconductor material. The upper epitaxial semiconductor layer 122*a* can cover the top surface of the first emitter region 133.1 and can be separated from the base 131 by an adjacent third sidewall spacer 115. The upper epitaxial semiconductor layer 122*a* can be selectively grown from the lower layer below so that it is also monocrystalline in structure and can be in situ doped so that it also has the second-type conductivity. In some embodiments, the lower epitaxial semiconductor layer 121 and the upper epitaxial semiconductor layer 122*a* of the emitter 133 can both be doped so as to have the second-type conductivity at essentially the same conductivity level (e.g., so that both the first emitter region 133.1 and the second emitter region 133.2 are N+ silicon emitter regions). In other embodiments, the lower epitaxial semiconductor layer 121 and the upper epitaxial semiconductor layer 122*a* can be doped so as to have the second-type conductivity at different conductivity levels.

In this embodiment, the collector 132 and the emitter 133 of the lateral HBT 150B can be asymmetric. Specifically, collector 132 of the lateral HBT 150B can include a first collector region 132.1 and a second collector region 132.2. on the first collector region 132.1. The first collector region 132.1 can be a doped region 123 within the semiconductor layer 105 above the insulator layer 103. This doped region 123 can have the second-type conductivity (e.g., N-type conductivity) at a relatively high conductivity level and can be positioned laterally adjacent to the first base region 131.1, which as mentioned above is also within the same semiconductor layer. Since the semiconductor layer 105 is made of the second semiconductor material (e.g., silicon germanium) this first collector region 132.1 can be, for example, an N or N+ silicon germanium collector region. The second collector region 132.2 can be another upper epitaxial semiconductor layer 122*b*, which, during processing, is concurrently grown and in situ doped along with the upper epitaxial semiconductor layer 122*a* of the emitter 133, which covers the top surface of the first collector region 132.1, and which is separated from the base 131 by an adjacent third sidewall spacer 115. Thus, for example, the second collector region 132.2 can be an N+ silicon collector region.

Alternatively, referring to the structure 200 in FIG. 2, in yet another embodiment, both the collector 232 and the emitter 233 of the lateral HBT 200 can include first regions, which are epitaxially grown within trenches that extends through the semiconductor layer 205 and the insulator layer 203 to the substrate 201; and second regions, which are epitaxially grown on the first regions.

More specifically, in the lateral HBT 200, first and second trenches can be on opposing sides of the base 231 and can extend through the semiconductor layer 205 and the insulator layer 203 to or into the top surface of the substrate 201 (e.g., to the well 202). Optionally, each of these trenches can undercut one or more of the sidewalls spacers positioned laterally adjacent to the base.

The collector 232 can include one or more epitaxial semiconductor layers 224a that overfill the first trench such that a first collector region 232.1 is within the first trench and such that a second collector region 232.2 is above the first trench and separated from the base 231 by an adjacent third sidewall spacer 215. Similarly, the emitter 233 can include one or more epitaxial semiconductor layers 224b that overfill the second trench such that a first emitter region 233.1 is within the second trench and such that a second emitter region 233.2 is above the second trench and separated from the base 231 by an adjacent third sidewall spacer 215. The epitaxial semiconductor layers 224a-224b can be selectively grown from the substrate at the bottom of the trenches so that these layers are monocrystalline in structure. The epitaxial semiconductor layers 224a-224b can be made of the first semiconductor material (e.g., silicon) or some other suitable collector/emitter semiconductor material, and can be in situ doped so as to have the second-type conductivity. In some embodiments, the epitaxial semiconductor layers 224a-224b can be concurrently grown and in situ doped during processing so that the collector 232 and the emitter 233 are essentially symmetric, each including a single relatively thick epitaxial semiconductor layer of the first semiconductor material (e.g., silicon) or of some other suitable collector/emitter semiconductor material and each being doped so as to have the second-type conductivity at essentially the same relatively high conductivity level. Thus, for example, collector 232, including the first and second collector regions, and the emitter 233, including the first and second emitter regions, could be symmetric N+ silicon regions. In other embodiments, the epitaxial semiconductor layer(s) 224a for the collector 232 and the epitaxial semiconductor layer(s) 224b of the emitter 233 could be formed during processing using discrete process steps so that the collector 232 and the emitter 233 are asymmetric (e.g., with different doping profiles, heights, etc.). Thus, for example, in some embodiments, the collector 232 could include a first collector region 232.1, which is an N− silicon collector region, and a second collector region 132.2, which is an N+ silicon collector region and the emitter 233 can include first and second emitter regions that are N+ silicon emitter regions.

Optionally, the lateral HBT 150A-150B, 250 can further include metal silicide layers 199, 299 on the uppermost surfaces of the base 131, 231, the collector 132, 232, and the emitter 133, 233. The metal silicide layers 199, 299 can be, for example, layers of cobalt silicide (CoSi), nickel silicide (NiSi), tungsten silicide (WSi), titanium silicide (TiSi), or any other suitable metal silicide material.

The structure 100A-100B, 200 can further include one or more dielectric layers covering the lateral HBT 150A-150B, 200. Although not shown, these dielectric layers can include, for example, one or more conformal dielectric layers (e.g., a conformal silicon nitride etch stop layer) and a blanket dielectric layer (e.g., a blanket silicon dioxide layer or a blanket layer of some other suitable dielectric material) on the conformal dielectric layer(s). The structure 100A-100B, 200 can further include middle of the line (MOL) contacts including contacts extending through the dielectric layer(s) to the base, collector, and emitter.

In any case, in the above-described embodiments, the connection(s) of the collector 132, 232 and/or the emitter 133, 233 to the substrate 100 effectively form thermal exit path(s) into the substrate and, thus, minimizes self-heating. Additionally, the second semiconductor material (e.g., silicon germanium) employed in the base region improves performance.

Figure 3:
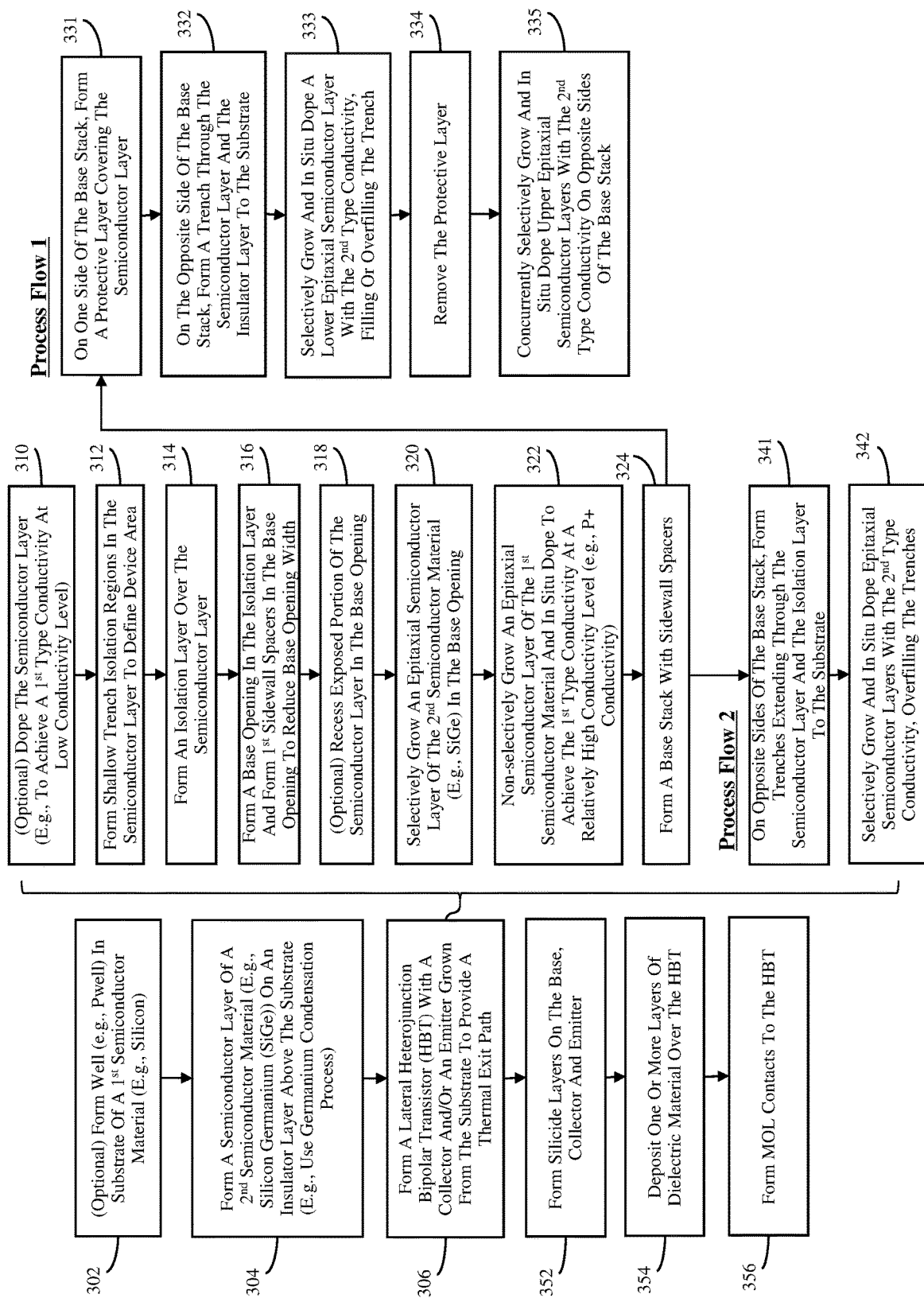
FIG. 3 is a flow diagram illustrating method embodiments for forming the structures of FIGS. 1A, 1B and 2.

Referring to the flow diagram of FIG. 3, also disclosed herein are embodiments of a method of forming a semiconductor-on-insulator structure (e.g., a silicon-on-insulator (SOI) structure), such as the structure 100A of FIG. 1A, the structure 100B of FIG. 1B or the structure 200 of FIG. 2, each including a lateral heterojunction bipolar transistor (HBT) 150A, 150B, 250, which includes a collector 132, 232 and/or an emitter 133, 233 grown from the substrate in order to form thermal exit path(s) through the substrate and which also includes a silicon germanium intrinsic base region for improved performance. As discussed above, those skilled in the art will recognize that a BJT will typically include three terminals: a collector, an emitter, and a base between the collector and the emitter. The base will include at least an extrinsic base region having a first-type conductivity and the collector and the emitter will have a second-type conductivity that is different from the first-type conductivity. Thus, for an NPN-type BJT, the base will include at least a P-type base between an N-type collector and an N-type emitter; whereas, for a PNP-type BJT, the base will include at least an N-type base between a P-type collector and a P-type emitter. For purposes of illustration, the disclosed method embodiments are described below with respect to the formation of an NPN-type lateral HBT 150A-150B, 250, where the first-type conductivity of the base is P-type and where the second-type conductivity of the collector and emitter is N-type. However, it should be understood that the description is not intended to be limiting and that, alternatively, similar method embodiments could be employed to form a PNP-type lateral HBT, where the first-type conductivity of the base is N-type, and where the second-type conductivity of the collector and emitter is P-type.

The method embodiments can begin with an initial structure including a substrate 101, 201; an insulator layer 103, 203 on the top surface of the substrate 101, 201; and an initial semiconductor layer 104, 204 on the insulator layer 103, 203. The substrate 102, 201 and the initial semiconductor layer 104, 204 can be a first semiconductor material (e.g., silicon or some other suitable semiconductor substrate material) and can be monocrystalline in structure. The substrate 101, 201 can be doped with a first-type conductivity dopant (e.g., a P-type dopant) so as to have a first-type conductivity (e.g., P-type conductivity) at a relatively low conductivity level. Thus, for example, the substrate 101, 201 can be a P− silicon substrate. The insulator layer 103, 203 can be a silicon dioxide layer (also referred to herein as a buried oxide (BOX) layer) or a layer of some other suitable insulator material.

Optionally, a dopant implantation process can be performed in order to form a well 102, 202 (also referred to as a dopant implant region) in the substrate 101, 201 at the top surface adjacent to the insulator layer 103, 203 (see process 302 and FIG. 4.1). Specifically, at process 302, a first-type conductivity dopant (e.g., a P-type dopant) can be implanted into the substrate 101, 201 adjacent to the top surface so that the resulting well 102, 202 has the first-type conductivity (e.g., P-type conductivity) at a higher conductivity level than the adjacent lower portion of the substrate 101, 201. Thus, for example, process 302 can be performed in order to form a Pwell in a P− silicon substrate.

The initial semiconductor layer 104, 204, which as mentioned above is made of the first semiconductor material (e.g., silicon), can be converted into a semiconductor layer 105, 205 made of a second semiconductor material (e.g., silicon germanium) that is different from the first semiconductor material (see process 304 and FIG. 4.2). For example, a germanium condensation process can be performed at process 304 in order to convert an initial silicon layer into a silicon germanium layer. Germanium condensation processing is well known in the art and, thus, the details of such processing has been omitted from this specification in order to allow the readers to focus on the salient aspects of the disclosed embodiments. The resulting silicon germanium layer can still be monocrystalline in structure. It should be noted that, alternatively, the initial structure could include a silicon germanium layer on an insulator layer as opposed to a silicon layer. In this case, germanium condensation processing could be omitted.

A lateral HBT can then be formed using the semiconductor layer (see process 306). Specifically, a dopant implantation process can optionally be performed in order to dope the semiconductor layer 105, 205 with a first-type conductivity dopant (e.g., a P-type dopant) such that the semiconductor layer 105, 205 has the first-type conductivity at a relatively low conductivity level (see process 310 and FIG. 4.2). For example, process 306 can be performed so that the semiconductor layer 105, 205 is a P− silicon germanium layer.

Shallow trench isolation (STI) region 106, 206 can be formed (see process 312 and FIGS. 4.3A and 4.3B). The STI regions 106, 206 be formed so that they define the boundaries of a device area and so that they extend essentially vertically through the semiconductor layer 105, 205 to the insulator layer 103, 203. Specifically, at process 304, trenches for STI regions can be formed (e.g., lithographically patterned and etched using conventional STI processing techniques) such that they extend essentially vertically through the semiconductor layer to the insulator layer and such that they define a device area within the semiconductor layer. The trenches can further be filled with one or more layers of isolation material (e.g., silicon dioxide, silicon nitride, etc.) and a chemical mechanical polishing (CMP) process can be performed to remove any of the isolation materials from above the semiconductor layer.

Next, an isolation layer 109, 209 can be formed over the semiconductor layer 105, 205 and adjacent STI regions 106, 206 (see process 314 and FIG. 4.4). This isolation layer 109, 209 can, for example, be a silicon dioxide layer formed at process 314 using a conventional oxidation process.

A base opening 110, 210 can then be formed in the isolation layer 109, 209 (see process 316 and FIGS. 4.5A and 4.5B). Specifically, at process 314, conventional lithographic processing and etch techniques can be performed in order to form a base opening 110, 210 in the isolation layer 109, 209. The base opening can, for example, be formed so that it extends vertically through the isolation layer 109, 209 to the semiconductor layer 105, 205, so that it completely traverses and exposes a center portion of the semiconductor layer, so that it has a first width (Wbo), and so that portions of the semiconductor layer on either side of the base opening 110, 210 remain covered. First sidewall spacers 108, 208 can then be formed within the base opening. For example, a dielectric spacer material can be conformally deposited so as to cover the top surface of the isolation layer 109, 209 and so as to line the base opening 110, 210 (see FIGS. 4.6A and 4.6B). The dielectric spacer material can be, for example, silicon nitride or some other suitable dielectric spacer material that is different from the isolation material of the isolation layer 109, 209 so that it can be selectively etched. Next, a selective anisotropic sidewall spacer etch process can be performed in order to remove the dielectric spacer material from horizontal surfaces, leaving it intact on vertical surfaces within the base opening (i.e., as the first sidewall spacers 108, 208). By forming the first sidewall spacers 108, 208 within the base opening 110, 210, the width of the base opening 110, 210 is narrowed from the first width (Wbo) to a second width (Wfbo) that is narrower than the first width and a first area of the semiconductor layer is exposed. It should be noted that the first width could be at or near the minimum width achievable using conventional state of the art lithographic patterning and the second width can be smaller than that minimum width. The exposed first area of the semiconductor layer within the base opening (e.g., see portion 125, 225) can, optionally, be recessed (see process 318 and FIG. 4.7). That is, a selective anisotropic etch process can be performed in order to recess the top surface of the exposed portion of the semiconductor layer within the base opening. This recessed portion 125, 225 of the semiconductor layer 105, 205 aligned below the base opening 110, 210 can correspond to a first base region 131.1, 231.1 of a base 131, 231 of the lateral HBT being formed. Thus, this first base region 131.1, 231.1 can be an undoped monocrystalline silicon germanium base region or a P− monocrystalline silicon germanium base region.

Then, a second base region 131.2, 231.2 can be formed in the base opening 110, 210 on the first base region 131.1, 231.1 (see process 320 and FIG. 4.8). Specifically, an epitaxial semiconductor layer 112, 212 of the second semiconductor material (e.g., silicon germanium) can be grown on the recessed top surface of the exposed portion of the semiconductor layer 105, 205 within the relatively narrow base opening 110, 210, which is defined by the space between first sidewall spacers 108, 208. The epitaxial semiconductor layer 112, 212 can be selectively grown at process 320 from the semiconductor layer 105, 205 so that it is essentially monocrystalline in structure. The epitaxial semiconductor layer 112, 212 can be grown at process 320 without any in-situ doping (i.e., so that it remains undoped/intrinsic). Alternatively, this epitaxial semiconductor layer can be in-situ doped at process 320 so it has the first-type conductivity at a relatively low conductivity level or so that it has a graded dopant profile (e.g., from undoped or low-doped near the semiconductor layer 105, 205 and higher doped away from the semiconductor layer 105, 205). Thus, for example, the second base region 131.2, 231.2 can be entirely a monocrystalline silicon germanium intrinsic base region (i-SiGe base) or, alternatively, doped so as to be P− or so as to have a graded dopant profile from undoped or P− to P or P+.

Another epitaxial semiconductor layer 113, 213 of the first semiconductor material (e.g., silicon) or some other suitable base semiconductor material can be grown on the second base region 131.1, 231.2 and over the isolation layer 109, 209 (see process 322 and FIG. 4.9). The epitaxial semiconductor layer 113, 213 can be non-selectively grown at process 322 so that it is essentially polycrystalline in structure. The epitaxial semiconductor layer 113, 213 can be in-situ doped at process 322 so as to have the first-type conductivity (e.g., P-type conductivity) at a relatively high conductivity level and, particularly, at a higher conductivity level then the substrate (and at a higher conductivity level than the lower base. Thus, for example, this epitaxial semiconductor layer 113, 213 can be a P+ polysilicon layer. A thin cap layer (e.g., a thin silicon nitride cap layer 114, 214) can be formed on the epitaxial semiconductor layer 113, 213 (see FIG. 4.9).

A base stack with can subsequently be formed (see process 324 and FIG. 4.10). Specifically, lithographic patterning and etch processes can be formed to define a third base region 131.3, 231.3 from a portion of the epitaxial semiconductor layer 113, 213 and to further define second sidewall spacers 107, 207 comprising remaining portions of the isolation layer 109, 209 positioned laterally adjacent to the first sidewall spacers 108, 208. Due to the lithographic patterning and etch processes performed at process 324, the resulting third base region 131.3, 231.3 is aligned above, immediately adjacent to, and wider than the second base region 131.2, 231.2 such that it extends laterally over the first sidewall spacers 108, 208 and the resulting second sidewall spacers 107, 207. Thus, the base 131, 231 is essentially T-shaped and opposing sidewalls of the third base region 131.3, 231.3 are essentially vertically aligned with outer vertical surfaces of the second sidewall spacers 107, 207.

Third sidewall spacers 115, 215 can then be formed adjacent the opposing sidewalls of the third base region 131.3, 231.3 and further adjacent to the outer vertical surfaces of the second sidewall spacers 107, 207 below (see FIG. 4.10). For example, another dielectric spacer material can be conformally deposited so as to cover the base stack. The dielectric spacer material used to form the third sidewall spacers can be, for example, silicon nitride or some other suitable dielectric spacer material. Next, a selective anisotropic sidewall spacer etch process can be performed in order to remove the dielectric spacer material from horizontal surfaces and, particularly, from second and third areas 117a-117b, 217a-217b, respectively, of the semiconductor layer 105, 205 on opposing sides of the base stack and leaving it intact on the vertical surfaces (i.e., as the third sidewall spacers 115, 215).

The partially completed structure shown in FIG. 4.10 can subsequently be processed according to the Process Flow I (see processes 331-335) to complete formation of either the lateral HBT 150A or the lateral HBT 150B.

Specifically, in the embodiments of the method used to form that lateral HBT 150A or 150B, either the collector or the emitter is formed so that it includes: a first region, which is epitaxially grown within a trench that extends through the semiconductor layer and the insulator layer to the substrate; and a second region, which is epitaxially grown on the first region. Referring to Process Flow I, a protective layer 116 (e.g., a silicon nitride protective layer) can be conformally deposited over the partially completed structure and, subsequently, lithographically patterned and etched so as to expose the second area 117a of the semiconductor layer 105 on one side of the base stack, while leaving the third area 117b of the semiconductor layer 105 on the opposite side of the base stack covered (see process 331 and FIG. 4.11). Selective etch processes can subsequently be performed to form a trench 118, which extends through the exposed second area 117a of the semiconductor layer 105 and which further extends through the insulator layer 103 to the top surface of the substrate 101 (e.g., at the well 102) (see process 332 and FIG. 4.12). Optionally, these selective etch processes can be selective isotropic etch processes so that the resulting trench 118 undercuts the second sidewall spacers 107 and, optionally, the first sidewalls spacers 108 below the third base region 131.3, as illustrated.

Next, a lower epitaxial semiconductor layer 121 of the first semiconductor layer (e.g., silicon) or of some other suitable collector/emitter semiconductor material can then be formed in the trench 118 and, more particularly, selectively grown from the substrate at the bottom of the trench 118 such that it is monocrystalline in structure (see process 333 and FIG. 4.13). The lower epitaxial semiconductor layer 121 can further be grown at process 333 so as to fill or, optionally, overfill the trench 118. The lower epitaxial semiconductor layer 121 can also be in situ doped at process 333 so as to have the second-type conductivity (e.g., N-type conductivity). Subsequently, the protective layer 116 can be selectively removed so as to expose the third area 117b of the semiconductor layer 105 on the opposite side of the base stack (see process 334 and FIG. 4.14). Following removal of the protective layer 116, upper epitaxial semiconductor layers 122a-122b of the first semiconductor material (e.g., silicon) or of some other suitable collector/emitter semiconductor material can be selectively grown from the exposed semiconductor surfaces of the lower epitaxial semiconductor layer 121 and the third area 117b of the semiconductor layer 105 (see process 335 and FIG. 4.15). The upper epitaxial semiconductor layers 122a-122b can be in situ doped at process 335 so as to have the second-type conductivity (e.g., N-type conductivity). A subsequent anneal process can cause dopants from the upper epitaxial semiconductor layer 122b to diffuse into the third area of the semiconductor layer to form a doped region 123 with the second-type conductivity.

During formation of the lateral HBT 150A of FIG. 1A, the lower epitaxial semiconductor layer 121 and the upper epitaxial semiconductor layer 122a can be the first and second collector regions 132.1 and 132.2, respectively, of the collector 132 and the doped region 123 and the upper epitaxial semiconductor layer 122b can be the first and second emitter regions 133.1-133.2. Contrarily, during formation of the lateral HBT 150B of FIG. 1B, the lower epitaxial semiconductor layer 121 and the upper epitaxial semiconductor layer 122a can be the first and second emitter regions 133.1 and 133.2, respectively, of the emitter and the doped region 123 and the upper epitaxial semiconductor layer 122b can be the first and second collector regions 133.1-133.2.

It should be noted that, processes 333 and 335 can be performed so that the lower epitaxial semiconductor layer and the upper epitaxial semiconductor layers 122a-122b all have the second-type conductivity at the same relatively high conductivity level (e.g., so that the layers 121 and 122a-122b are all N+ silicon layers). Alternatively, processes 333 and 335 can be performed so that the lower epitaxial semiconductor layer 121 and the second epitaxial semiconductor layer 122a have the second-type conductivity at different conductivity levels. For example, optionally, in the lateral HBT 150A of FIG. 1A, the lower epitaxial semiconductor layer 121, which forms the first collector region 132.1, can be doped so as to have a lower conductivity level than the upper epitaxial semiconductor layer 122a, which forms the second collector region 132.2 (e.g., so that the first collector region 132.1 is an N– silicon collector region and so that the second collector region 132.2 is an N+ silicon collector region).

Alternatively, the partially completed structure of FIG. 4.10 can subsequently be processed according to the Process Flow II (see processes 341-342) to complete formation of the lateral HBT 200.

Specifically, in the embodiments of the method used to form that lateral HBT 200, the collector and the emitter are each formed so as to include: a first region, which is epitaxially grown within a trench that extends through the semiconductor layer and the insulator layer to the substrate; and a second region, which is epitaxially grown on the first region. Referring to Process Flow II, selective etch processes can subsequently be performed to form first and second trenches 218a and 218b, which extend through the exposed second and third areas 217a and 217b of the semiconductor layer 205 on opposite sides of the base stack and which further extend through the insulator layer 203 to the top surface of the substrate 201 (e.g., at the well 202) (see process 341 and FIG. 4.16). Optionally, these selective etch processes can be selective isotropic etch processes so that the resulting trenches 218a-218b undercut the second sidewall spacers 207 and, optionally, the first sidewalls spacers 208 below the third base region 231.3, as illustrated. One or more epitaxial semiconductor layers of the first semiconductor layer (e.g., silicon) or of some other suitable collector/emitter semiconductor material can then be formed in the first and second trenches 218a-218b and, more particularly, selectively grown from the substrate at the bottoms of the trenches 218a-218b such that they are monocrystalline in structure (see process 342 and FIG. 4.17). The epitaxial semiconductor layers can further be grown at process 342 so as overfill the first and second trenches 218a-218b. The resulting collector 232 can include the one or more epitaxial semiconductor layers 224a that overfill the first trench 218a (with the first collector region 232.1 being within the first trench 218a and with the second collector region 232.2 being above the first trench 218a and separated from the base 231 by an adjacent third sidewall spacer 215). Similarly, the resulting emitter 233 can include the one or more epitaxial semiconductor layers 224b that overfill the second trench 218b (with the first emitter region 233.1 being within the second trench and with the second emitter region 233.2 being above the second trench and separated from the base 231 by an adjacent third sidewall spacer 215).

In any case, the epitaxial semiconductor layer(s) 224a overfilling the first trench 218a and the epitaxial semiconductor layer(s) 224b overfilling the second trench 218b can all be in situ doped at process 342 so as to have the second-type conductivity (e.g., N-type conductivity).

In some embodiments, the epitaxial semiconductor layer(s) 224a overfilling the first trench 218a and the epitaxial semiconductor layer(s) 224b overfilling the second trench 218b can be concurrently grown at process 342 and in situ doping can be performed so that the collector 232 and the emitter 233 are essentially symmetric, each including a single relatively thick epitaxial semiconductor layer of the first semiconductor material (e.g., silicon) or of some other suitable collector/emitter semiconductor material and each being doped so as to have the second-type conductivity (e.g., N-type conductivity) at essentially the same relatively high conductivity level. Thus, for example, collector 232, including the first and second collector regions, and the emitter 233, including the first and second emitter regions, could be symmetric N+ silicon regions. In other embodiments, the epitaxial semiconductor layer(s) 224a overfilling the first trench 218a and the epitaxial semiconductor layer(s) 224b overfilling the second trench 218b can be grown at process 342 using discrete process steps so that the resulting collector 232 and resulting the emitter 233 are asymmetric (e.g., with different doping profiles, heights, etc.). Thus, for example, in some embodiments, the collector 232 could include a first collector region 232.1, which is an N− silicon collector region within the first trench 218a, and a second collector region 132.2, which is an N+ silicon collector region above the first trench 218a, and the emitter 233 can include first and second emitter regions that are N+ silicon emitter regions.

Optionally, the method embodiments can further forming metal silicide layers 199, 299 on the uppermost surfaces of the base 131, 231, the collector 132, 232, and the emitter 133, 233 (see process 352 and FIGS. 1A, 1B and 2). The metal silicide layers 199, 299 can be, for example, layers of cobalt silicide (CoSi), nickel silicide (NiSi), tungsten silicide (WSi), titanium silicide (TiSi), or any other suitable metal silicide material. Techniques for forming metal silicide layers are well known in the art and, thus, have been omitted from the specification to allow the reader to focus on the salient aspects of the disclosed embodiments.

The method embodiments can further include formation of one or more dielectric layers covering the lateral HBT 150A-150B, 200 (see process 354). Although not shown, these dielectric layers can include, for example, one or more conformal dielectric layers (e.g., a conformal silicon nitride etch stop layer) and a blanket dielectric layer (e.g., a blanket silicon dioxide layer or a blanket layer of some other suitable dielectric material) on the conformal dielectric layer(s). The method embodiments can further include formation of middle of the line (MOL) contacts including contacts extending through the dielectric layer(s) to the base, collector, and emitter (see process 356).

Additionally, it should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a substrate comprising a first semiconductor material;
    an insulator layer on the substrate;
    a semiconductor layer on the insulator layer, wherein the semiconductor layer comprises a second semiconductor material different from the first semiconductor material; and
    a transistor comprising:
        a base on the insulator layer, the base comprising:
            a first base region within the semiconductor layer;
            a second base region on the first base region and comprising the second semiconductor material; and
            a third base region on the second base region;
        a collector; and
        an emitter, wherein the base is positioned laterally between the collector and the emitter and wherein at least one of the collector and the emitter comprises:
            a first region within a trench that extends through the semiconductor layer and the insulator layer to the substrate, wherein the first region comprises an upper surface above an upper surface of the first base region; and
            a second region on the first region.

2. The structure of claim 1, wherein the first semiconductor material comprises silicon and the second semiconductor material comprises silicon germanium.

3. The structure of claim 1,
    wherein the third base region is wider than the second base region, and
    wherein the structure further comprises:
        first sidewall spacers positioned laterally adjacent to the second base region;
        second sidewall spacers positioned laterally adjacent to the first sidewall spacers, wherein the third base region extends laterally over the first sidewall spacers and the second sidewall spacers; and
        third sidewall spacers positioned laterally adjacent to the second sidewall spacers and the third base region.

4. The structure of claim 3,
    wherein the collector comprises:
        a first collector region in the trench that extends through the semiconductor layer and the insulator layer to the substrate; and
        a second collector region on the first collector region, and
    wherein the emitter comprises:
        a first emitter region within the semiconductor layer above the insulator layer; and
        a second emitter region on the first emitter region.

5. The structure of claim 4, wherein the first collector region has a lower conductivity level than the second collector region.

6. The structure of claim 3,
    wherein the emitter comprises:
        a first emitter region in the trench that extends through the semiconductor layer and the insulator layer to the substrate; and
        a second emitter region on the first emitter region, and
    wherein the collector comprises:
        a first collector region within the semiconductor layer above the insulator layer; and
        a second collector region on the first collector region.

7. The structure of claim 3,
    wherein the collector comprises:
        a first collector region in a first trench that extends through the semiconductor layer and the insulator layer to the substrate; and
        a second collector region on the first collector region, and
    wherein the emitter comprises:
        a first emitter region in a second trench that extends through the semiconductor layer and the insulator layer to the substrate; and
        a second emitter region on the first emitter region.

8. The structure of claim 7, wherein the first collector region has a lower conductivity level than the second collector region.

9. The structure of claim 1, further comprising a well within the substrate and aligned below the transistor and adjacent to the insulator layer.

10. A method comprising:
forming a semiconductor layer on an insulator layer above a substrate, wherein the substrate comprises a first semiconductor material and the semiconductor layer comprises a second semiconductor material that is different from the first semiconductor material; and
forming a transistor comprising:
a base on the insulator layer, the base comprising:
a first base region within the semiconductor layer;
a second base region on the first base region and comprising the second semiconductor material; and
a third base region on the second base region;
a collector; and
an emitter, wherein the base is positioned laterally between the collector and the emitter and wherein at least one of the collector and the emitter comprises:
a first region within a trench that extends through the semiconductor layer and the insulator layer to the substrate, wherein the first region comprises an upper surface above an upper surface of the first base region; and
a second region on the first region.

11. The method of claim 10, wherein the first semiconductor material comprises silicon, wherein the second semiconductor material comprises silicon germanium, and wherein the forming of the semiconductor layer comprises converting a silicon layer on the insulator layer to a silicon germanium layer using a germanium condensation process.

12. The method of claim 10, wherein the forming of the transistor comprises:
forming the base, wherein the forming of the base comprises:
forming an isolation layer over the semiconductor layer;
forming a base opening in the isolation layer;
lining sidewalls of the base opening with first sidewall spacers;
recessing an exposed first area of the semiconductor layer within the base opening, wherein the exposed first area of the semiconductor layer comprises the first base region;
forming the second base region within the base opening, above the first base region, and comprising the second semiconductor material;
forming the third base region on and wider than the second base region, wherein the third base region extends laterally over the first sidewall spacers and further over second sidewall spacers adjacent to the first sidewall spacers; and
forming third sidewall spacers positioned laterally adjacent to the second sidewall spacers and the third base region.

13. The method of claim 12,
wherein the forming of the base exposes a second area of the semiconductor layer and a third area of the semiconductor layer on opposing sides of the base,
wherein the method further comprises forming the collector and the emitter, and
wherein the forming of the collector and the emitter comprises:
forming a protective layer on the third area of the semiconductor layer;
performing etch processes to form the trench through the second area of the semiconductor layer and further extending through the insulator layer;
forming a lower epitaxial semiconductor layer in the trench;
removing the protective layer to expose the third area of the semiconductor layer;
forming upper epitaxial semiconductor layers on the lower epitaxial semiconductor layer and on the third area of the semiconductor layer; and
performing an anneal process, wherein, during the anneal process, dopants diffuse into the third area of the semiconductor layer to form a doped region.

14. The method of claim 13,
wherein the collector comprises:
a first collector region comprising the lower epitaxial semiconductor layer in the trench; and
a second collector region comprising one upper epitaxial semiconductor layer on the lower epitaxial semiconductor layer,
wherein the emitter comprises:
a first emitter region comprising the doped region within the third area of the semiconductor layer; and
a second emitter region comprising another upper epitaxial semiconductor layer on the third area of the semiconductor layer.

15. The method of claim 14, wherein the lower epitaxial semiconductor layer and each upper epitaxial semiconductor layer are in situ doped so that the lower epitaxial semiconductor layer has a lower conductivity level than each upper epitaxial semiconductor layer.

16. The method of claim 13,
wherein the emitter comprises:
a first emitter region comprising the lower epitaxial semiconductor layer in the trench; and
a second emitter region comprising one upper epitaxial semiconductor layer on the lower epitaxial semiconductor layer, and
wherein the collector comprises:
a first collector region comprising the doped region within the third area of the semiconductor layer; and
a second collector region comprising another upper epitaxial semiconductor layer on the third area of the semiconductor layer.

17. A method comprising:
forming a semiconductor layer on an insulator layer above a substrate, wherein the substrate comprises a first semiconductor material and the semiconductor layer comprises a second semiconductor material that is different from the first semiconductor material; and
forming a transistor comprising:
a base on the insulator layer, the base comprising:
a first base region within the semiconductor layer;
a second base region on the first base region and comprising the second semiconductor material; and
a third base region on the second base region;
a collector; and
an emitter, wherein the base is positioned laterally between the collector and the emitter and wherein both the collector and the emitter comprise:
a first region within a trench that extends through the semiconductor layer and the insulator layer to the substrate, wherein the first region comprises an upper surface above an upper surface of the first base region; and a second region on the first region.

18. The method of claim 17, wherein the first semiconductor material comprises silicon, wherein the second semiconductor material comprises silicon germanium, and wherein the forming of the semiconductor layer comprises converting a silicon layer on the insulator layer to a silicon germanium layer using a germanium condensation process.

19. The method of claim 17, wherein the forming of the transistor comprises:

forming the base, wherein the forming of the base comprises:

forming an isolation layer over the semiconductor layer;

forming a base opening in the isolation layer;

lining sidewalls of the base opening with first sidewall spacers;

recessing an exposed first area of the semiconductor layer within the base opening, wherein the exposed first area of the semiconductor layer comprises a first base region;

wherein the third base region is wider than the second base region, and wherein the third base region extends laterally over the first sidewall spacers and further over second sidewall spacers adjacent to the first sidewall spacers; and forming third sidewall spacers positioned laterally adjacent to the second sidewall spacers and the third base region.

20. The method of claim 19, wherein the forming of the base exposes a second area of the semiconductor layer and a third area of the semiconductor layer on opposing sides of the base, wherein the method further comprises forming the collector and the emitter, and wherein the forming of the collector and the emitter comprises:

performing etch processes to form trenches that extend through the first area and the second area of the semiconductor layer and that further extend through the insulator layer to the substrate; and depositing epitaxial semiconductor layers and overfilling the trenches such that the collector comprises a first collector region in a first trench and a second collector region above the first collector region and such that the emitter comprises a first emitter region in a second trench and a second emitter region above the first emitter region.

* * * * *